US007615873B2

(12) United States Patent
Steers et al.

(10) Patent No.: US 7,615,873 B2
(45) Date of Patent: Nov. 10, 2009

(54) SOLDER FLOW STOPS FOR SEMICONDUCTOR DIE SUBSTRATES

(75) Inventors: Mark Steers, West Sussex (GB); George W. Pearson, West Sussex (GB)

(73) Assignee: International Rectifier Corporation, El Segundo, CA (US)

( * ) Notice: Subject to any disclaimer, the term of this patent is extended or adjusted under 35 U.S.C. 154(b) by 565 days.

(21) Appl. No.: 11/112,688

(22) Filed: Apr. 21, 2005

(65) Prior Publication Data

US 2005/0253258 A1    Nov. 17, 2005

Related U.S. Application Data

(60) Provisional application No. 60/564,664, filed on Apr. 21, 2004.

(51) Int. Cl.
  *H01L 23/48*  (2006.01)
  *H01L 23/52*  (2006.01)
  *H01L 29/40*  (2006.01)

(52) U.S. Cl. ............... 257/786; 257/779; 257/731; 257/E23.02

(58) Field of Classification Search ........ 257/782, 257/783, 786, 773, 779, 730, 731, 734, E23.04, 257/E23.015, E23.02, E23.023
See application file for complete search history.

(56) References Cited

U.S. PATENT DOCUMENTS

| | | | |
|---|---|---|---|
| 4,183,611 A * | 1/1980 | Casciotti et al. ............. 439/876 |
| 4,908,689 A | 3/1990 | McBride et al. ............... 357/67 |
| 5,152,451 A | 10/1992 | Darveaux et al. .......... 228/180.2 |
| 5,186,383 A | 2/1993 | Melton et al. ............ 228/180.2 |
| 5,281,684 A | 1/1994 | Moore et al. .................. 427/96 |
| 5,282,565 A | 2/1994 | Melton .................. 228/180.22 |
| 5,327,013 A | 7/1994 | Moore et al. ................. 257/772 |
| 5,390,080 A | 2/1995 | Melton et al. ............... 361/765 |
| 5,400,950 A | 3/1995 | Myers et al. ............ 228/180.22 |
| 5,410,184 A | 4/1995 | Melton et al. ................ 257/772 |
| 5,452,842 A | 9/1995 | Melton et al. .......... 228/180.22 |
| 6,189,203 B1 | 2/2001 | Heinrich et al. ............... 29/606 |
| 6,310,301 B1 | 10/2001 | Heinrich et al. ............. 174/260 |
| 6,391,678 B1 | 5/2002 | Paszkiet et al. ............. 438/106 |
| 6,402,012 B1 | 6/2002 | Bolduc .................. 228/180.22 |
| 6,436,730 B1 | 8/2002 | Melton et al. ................ 438/108 |
| 6,531,663 B1 | 3/2003 | Isenberg et al. ............. 174/260 |
| 6,696,764 B2 * | 2/2004 | Honda ......................... 257/778 |
| 6,747,875 B2 | 6/2004 | Wildrick et al. ............. 361/736 |
| 6,750,084 B2 | 6/2004 | Delheimer .................. 438/117 |

(Continued)

OTHER PUBLICATIONS

L. Halbo, "Electronic Components, Packaging and Production," Chapter 3, pp. 3.1-3.53, 1993; revised 1995, Printed by Strandberg & Nilsen Grafisk.

(Continued)

*Primary Examiner*—Davienne Monbleau
*Assistant Examiner*—Dilinh P Nguyen
(74) *Attorney, Agent, or Firm*—Farjami & Farjami LLP

(57) ABSTRACT

A substrate, which has semiconductor die arranged thereon, uses at least one solder flow stop, closely surrounding at least a portion of at least one mounting pad on which the die are mounted, to prevent die rotation during solder reflow. The at least one solder stop is non-wetting, during a solder reflow process, to solder used to mount the die.

8 Claims, 4 Drawing Sheets

U.S. PATENT DOCUMENTS

| | | | |
|---|---|---|---|
| 6,841,887 B2 * | 1/2005 | Araki .......................... | 257/782 |
| 2002/0036345 A1 * | 3/2002 | Iseki et al. .................. | 257/734 |
| 2002/0084521 A1 * | 7/2002 | Coyle et al. ................. | 257/690 |
| 2006/0103005 A1 * | 5/2006 | Schulz-Harder et al. .... | 257/703 |

OTHER PUBLICATIONS

D.H. Carey, "Trends in low-cost, high-performance substrate technology," abstract, IEEE Micro, 13(2):19-27, Apr. 1993, 2005 Institution of Electrical Engineers, Dialog® File No. 2, Accession No. 4423478.

S.E. Larson et al., "Comparison of various substrate technologies under steady state and transient conditions," abstract, The Ninth Intersociety Conference on Thermal and Thermomechanical Phenomena in Electronic Systems (IEEE Cat. No. 04CH37543), vol. 2, pp. 648-654, 2005 Institution of Electrical Engineers, Dialog® File No. 2, Accession No. 8117972.

T. Senese, "Trends in electronic substrate technology," abstract, Electronic Packaging and Production, 30(9):40-43, Sep. 1990, 2005 Institution of Electrical Engineers, Dialog® File No. 2, Accession No. 3803127.

* cited by examiner

SOLDER FLOW STOPS FOR SEMICONDUCTOR DIE SUBSTRATES

CROSS-REFERENCE TO RELATED APPLICATION

This application is based on and claims benefit of U.S. Provisional Application No. 60/564,664, filed on Apr. 21, 2004, entitled INSULATED METAL SUBSTRATE USING SOLDER FLOW STOPS, to which a claim of priority is hereby made and the disclosure of which is incorporated by reference herein.

FIELD OF THE INVENTION

The field of the invention is the mounting of semiconductor die on conductive pads of a substrate and preventing the rotation of the die during solder reflow.

BACKGROUND OF THE INVENTION

Semiconductor die are commonly soldered or otherwise secured to the conductive pads of a substrate. One typical substrate is an insulated metal substrate (IMS).

Thus, IMS substrates are well known for mounting electronic components and insulating them from the substrate on which the devices are mounted. IMS reduces thermal impedance and conducts heat more efficiently than conventional printed circuit boards. While the invention is described herein as applied to an IMS substrate, it will be understood that the invention applies to a novel process of securing semiconductor die to the die pads of any type of substrate including direct-bond copper (DBC), FR4 and the like.

FIG. 2 shows a cross section of a conventional IMS structure. The conventional IMS structure includes a dielectric layer 14, which is usually a polymer sandwiched between copper circuit layer 12 and aluminum base layer 16. The circuit layer 12 will be patterned by conventional processes to provide pads for die mounting and related traces which form wiring interconnects between die. The dielectric layer 14 may be any conventional dielectric material that bonds to layers 12 and 14, and is thin and thermally conductive. Once the pads for die mounting are defined on the circuit layer, semiconductor die are to be soldered thereto.

Automated placement and soldering of the die is performed by placing the die with conventional pick and place tools together with solder wafers, and by a process of solder reflow to bond the die to the mounting pads defined in the circuit layer 12. Thereafter, the die are wire bonded to one another and/or to conductive lands of the substrate on which other die are mounted.

It has been found that, during the conventional solder reflow process, the rectangular die rotate more or less about an axis perpendicular to their surfaces. With the die so misaligned, the die or wire used to bond the die are subject to damage during wire bonding. The die may be damaged due to the bonder head striking improperly positioned die. The wire may be damaged by the bonding tool and misplaced wire bond.

It would be very desirable to prevent such die rotation during the solder reflow operation to prevent such die and wire damage during wire bonding.

SUMMARY OF THE INVENTION

In accordance with the invention, a novel solder flow stop is used to prevent die rotation of semiconductor die, on a conductive pad of a substrate, during solder reflow. It is known to use solder stops, dams or barriers to control solder flow during reflow of the solder. Such solder stops are disclosed, for example, in U.S. Pat. No. 6,391,678 to Paszkiet et al.; U.S. Pat. No. 4,908,689 to McBride et al.; U.S. Pat. No. 5,282,565 to Melton; and U.S. Pat. No. 6,531,663 to Isenberg et al. In accordance with the invention, the solder flow stops surround the mounting pads (or portions thereof) that receive the solder bonds between the die and the mounting pads. The die float on molten solder during solder reflow, which can cause misalignment of the die in the absence of the solder flow stops. A non-wetting solder flow stop acts to restrain the solder from flowing beyond the flow stop but further prevents misalignment (rotation) of the die.

Other features and advantages of the present invention will become apparent from the following description of the invention which refers to the accompanying drawings.

DETAILED DESCRIPTION

Figure 1:
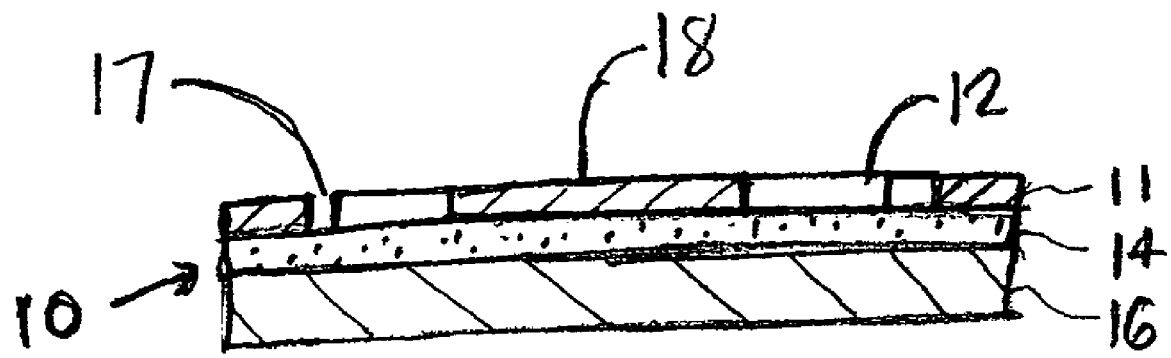
FIG. 1 illustrates one embodiment of the invention in a cross-sectional view.
Figure 2:
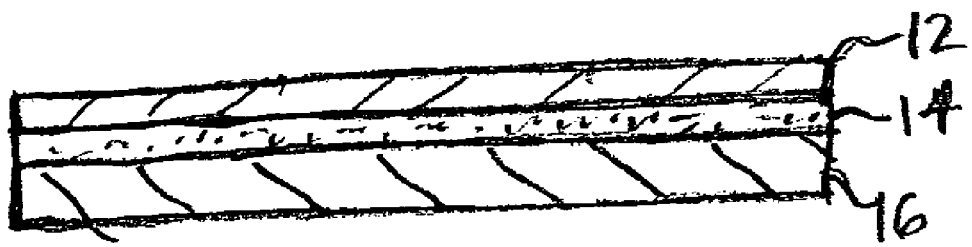
FIG. 2 illustrates a known insulated metal substrate in a cross-sectional view.

FIG. 1 illustrates one embodiment of the present invention. A solder flow stop 11 surrounds a copper mounting pad 18, which is etched out of copper layer 12, on the surface of an insulated metal substrate 10. Flow stop 11 can be aluminum, which is non-wetting to a solder of tin-lead. Aluminum is also used for the flow stops 24, 26, 28, 30, 32, 34 in FIG. 3; however, any material that is non-wetting to the solder and circuit layer 12 during the solder reflow process may be used as the solder flow stop. Non-wetting means that the material is comparatively non-wetting with respect to the material of circuit layer 12 (copper) and the solder, such that the solder tends to stay on the mounting pad 18. Aluminum is a preferred material for this solder and circuit layer 12 combination. Other solder flow stop materials may be preferred for other combinations of solder and circuit layer 12 material.

Solder metals which can be used include tin-lead, tin-lead-silver, tin-antimony, lead-indium, tin-lead-indium, tin-bismuth, tin-lead-bismuth and the like.

Figure 4:
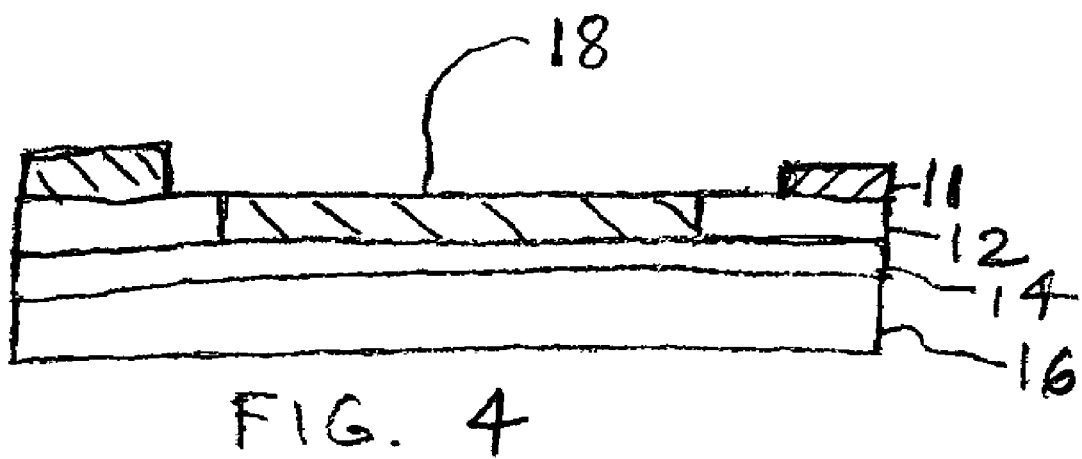
FIG. 4 illustrates another embodiment of the invention in a cross-sectional view.

The solder flow stop 11 may be substantially level with the pad 18 of layer 12, as shown in FIG. 1. The gap 17 between the stop 11 and the circuit layer 12 may have a very small finite gap distance or may be omitted entirely, abutting the circuit layer 12 directly against the stop 11. By providing a finite gap 17, thermal expansion mismatch and excess solder may be accommodated. However, the gap should be sufficiently small to prevent die rotation during reflow from exceeding about 2 to 3 degrees. The solder flow stop 11 may have an upper surface that is elevated above the mounting pads 18 formed by the circuit layer 12. Thus, as shown in FIG. 4, for example, the solder flow stop 11 is printed on the circuit layer 12, directly, either before or after patterning of the circuit layer 12. In any case, the retention of the solder on the mounting pad 18 helps to prevent misalignment of the die during solder reflow, such as by rotation of the die.

Figure 3:
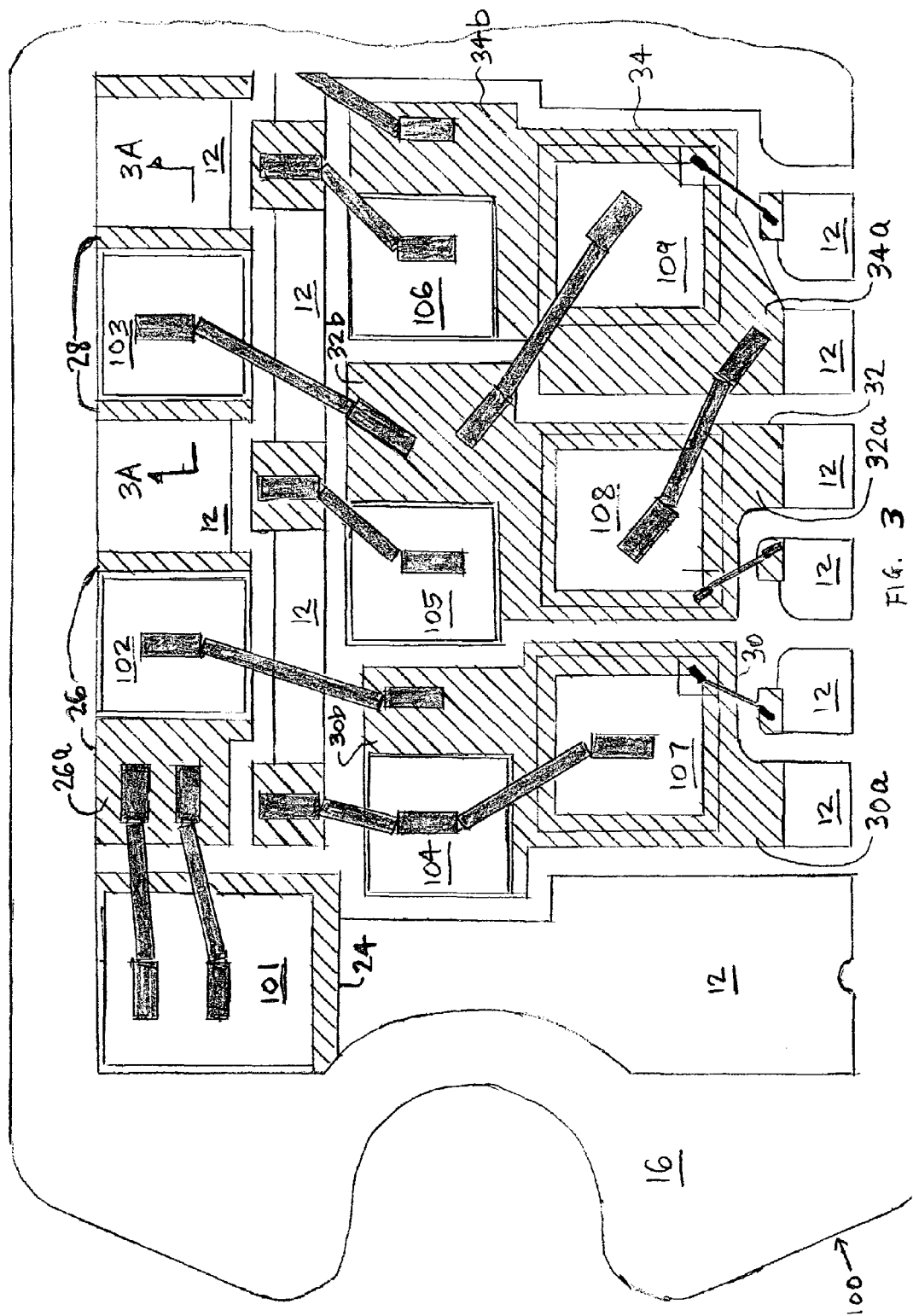
FIG. 3 show the results after solder reflow for soldering of components on IMS using solder flow stops.

Referring next to FIG. 3, there is shown a suitable circuit substrate 100, which may be IMS and has an aluminum baseplate 16 on which the copper layer 12 has been patterned to form suitable conductive traces and conductive mounting pads which are beneath semiconductor die 101 to 109. In accordance with the invention, the mounting pads receiving die 101 to 109 are surrounded, at least in part, by aluminum solder flow stop areas 24, 26, 28, 30, 32 and 34. Note that areas 26, 30, 32 and 34 extend outward from their respective die to bond pad areas such as areas 26a, 30a, 30b, 32a, 32b, 34a, 34b. Other bond pad areas are also provided as shown.

Figure 3A:
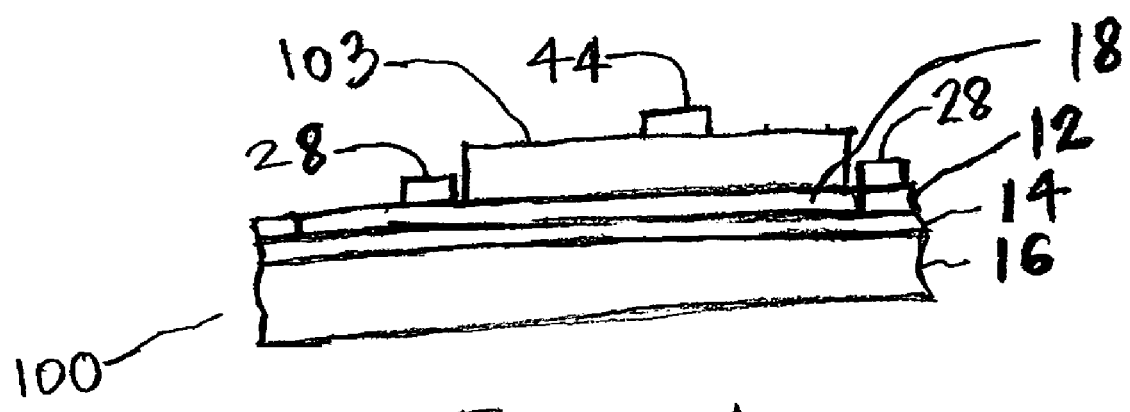
FIG. 3A is a cross-sectional view of a portion of FIG. 3, viewed at section line 3A-3A on FIG. 3.

As shown in FIGS. 3 and 3A, after solder reflow, wire bonds can be made among the various die and bond pads, using a conventional ultrasonic wire bond process, to bond the bond wires, which may be aluminum, to the bond pads and the various die.

FIG. 3 shows the benefit of adding aluminum solder flow stop areas 24, 26, 28, 30, 32, 34 on copper mounting pads. Molten solder does not wet the aluminum flow stops of FIG. 3, which prevents the flow of solder from the mounting pads. Thus, die 101 to 109 remain aligned after solder reflow.

FIG. 3A is a cross-sectional view of a portion of FIG. 3 taken across section line 3A-3A in FIG. 3. A baseplate 16 of aluminum is of 2 mm thickness. Dielectric layer 14 is a polymer dielectric material of 170 µm thickness. Copper layer 12 is a circuit layer of 85 µm thickness. The copper mounting pad 18 is patterned within copper layer 12. The die 103 is mounted on the copper mounting pad 18, and solder flow stops 28 of aluminum, which is 40 µm thick, closely abut two edges of the die 103. An aluminum wire 44 is then wire bonded to the top electrode of die 103 and to land 32b, connecting the top of die 103 to the bottom of die 105. Similar wire bonds are used throughout and will be well known to those skilled in this field.

Significantly, each die is closely bounded by a solder flow stop which also blocks its rotation during solder reflow.

Although the above disclosure has focused on insulated metal substrates, it should be noted that the invention is not limited to insulated metal substrates, but is applicable to any substrates that use solder for mounting one or more electronic components. Such substrates include, but are not limited to, epoxy-glass substrates, for example, FR4 substrates, paper phenolic substrates, DBC, ceramic substrates, silicon substrates, printed circuit boards (PCB), printed wiring bonds (PWB), and flexible circuits.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A substrate having at least one conductive mounting pad on which at least one die is mountable by soldering, said mounting pad having at least one solder flow stop around at least a portion of its periphery and being relatively closely spaced from the periphery of said mounting pad; wherein said substrate comprises a dielectric layer formed on a base layer and a circuit layer formed on said dielectric layer, a portion of said circuit layer comprising said at least one conductive mounting pad, and wherein said flow stop includes an upper surface level with an upper surface of said circuit layer, wherein said conductive mounting pad is comprised of a first metallic body and said solder flow stop is comprised of a second metallic body different from said first metallic body and non-wetting, during a solder reflow process, to a solder which is usable for mounting the at least one die on said at least one conductive mounting pad.

2. The substrate of claim 1, wherein the at least one solder flow stop is made of aluminum.

3. The substrate of claim 1, wherein the at least one solder flow stop is aluminum and has a bond pad area extending therefrom.

4. The substrate of claim 3, wherein the solder used is made of tin-lead.

5. The substrate of claim 1, wherein the at least one solder flow stop surrounds at least a portion of the circuit layer.

6. The substrate of claim 1, wherein there is a gap between the at least one solder flow stop and the circuit layer.

7. The substrate of claim 1, wherein the solder used is an alloy selected from the group of alloys consisting of tin-lead, tin-lead-silver, tin-antimony, lead-indium, tin-lead-indium, tin-bismuth, and tin-lead-bismuth.

8. The substrate of claim 1, wherein the substrate is selected from the group of substrates consisting of insulated metal substrate, epoxy-glass substrate, paper phenolic substrate, direct-bond copper, ceramic substrate, silicon substrate, printed circuit board, printed wiring board, and flexible circuit.

* * * * *